United States Patent [19]

Ralstin

[11] 4,435,724

[45] Mar. 6, 1984

[54] SINGLE PIECE CARRIER FOR INTEGRATED CIRCUIT DEVICES

[75] Inventor: Donald E. Ralstin, South Bend, Ind.

[73] Assignee: Wells Electronics, Inc., South Bend, Ind.

[21] Appl. No.: 301,001

[22] Filed: Sep. 10, 1981

[51] Int. Cl.³ .................... H01L 23/42; H01L 39/02; H02G 13/08
[52] U.S. Cl. ........................................ 357/79; 357/80; 174/52 FP; 174/52 R
[58] Field of Search ............. 357/79, 80, 81 R, 81 A, 357/74; 361/403, 401, 419, 421, 380, 394, 417, 418; 174/52 R, 52 H, 525, 54, 55, 58, 52 FP; 339/241, 248 S, 252 R, 258 R

[56] References Cited

U.S. PATENT DOCUMENTS

| 3,377,514 | 4/1968 | Ruehlemann et al. | 357/74 X |
| 3,409,861 | 11/1968 | Barnes et al. | 357/74 X |
| 4,018,981 | 3/1977 | Hawkins | 174/52 R |

FOREIGN PATENT DOCUMENTS 566100 8/1975 Switzerland ................. 174/52 R

*Primary Examiner*—Martin H. Edlow
*Assistant Examiner*—J. L. Badgett
*Attorney, Agent, or Firm*—James D. Hall

[57] ABSTRACT

A single piece carrier which is for an integrated circuit device having oppositely extending leads and which utilizes opposed marginal tabs connected to torsional bar parts to hold the integrated circuit device within the carrier.

5 Claims, 10 Drawing Figures

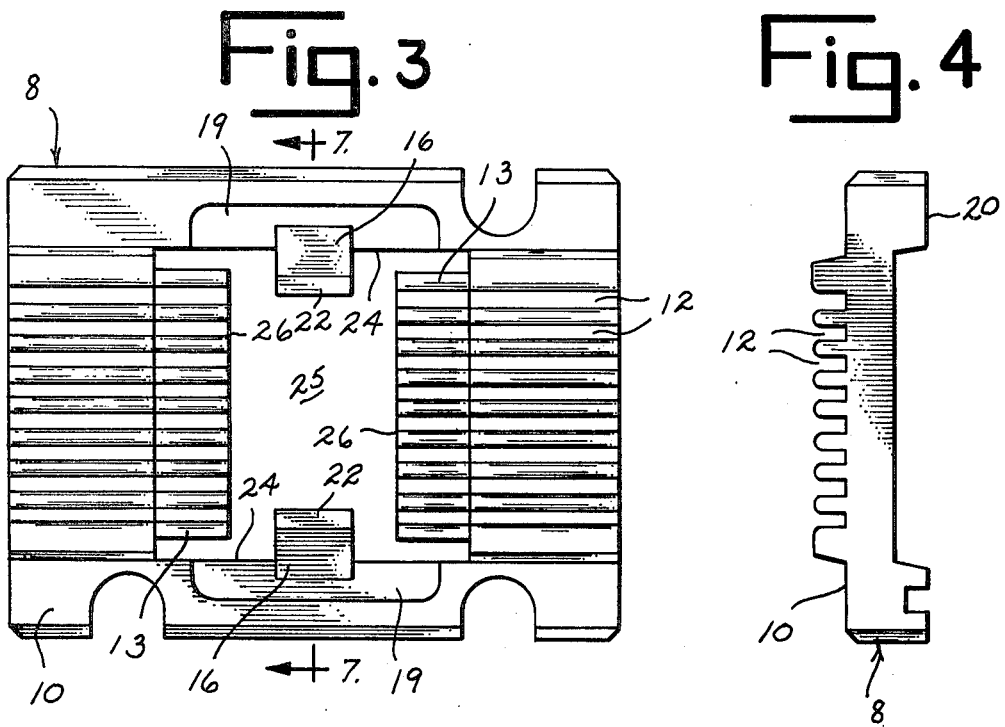
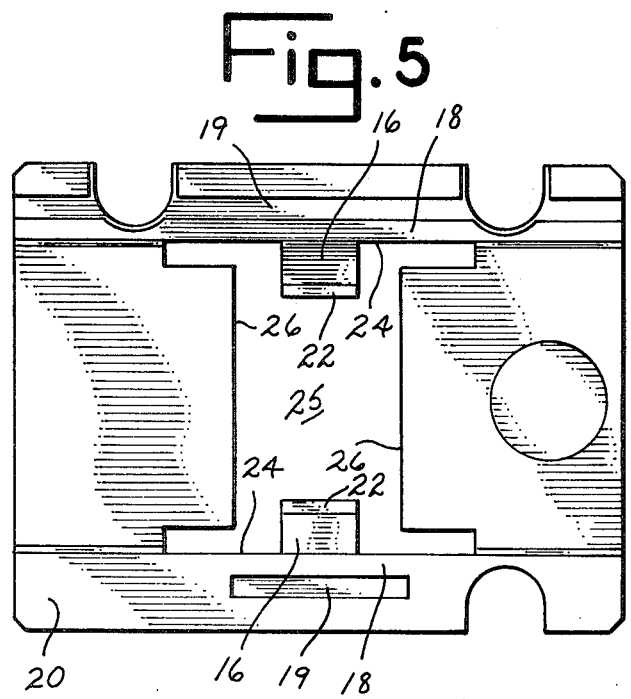

SINGLE PIECE CARRIER FOR INTEGRATED CIRCUIT DEVICES

SUMMARY OF THE INVENTION

This invention relates to a single piece carrier for an integrated circuit device having oppositely extending leads and commonly known as the flatpack type.

In this invention, the carrier is designed with opposed arms or tabs which extend upwardly from either side of an opening formed within the carrier. Each tab is connected at its lower end to a rotatable bar part which allows the connected tab to be moved between open and closed positions. When the tabs are in their open positions, the integrated circuit device can be fitted into the carrier. When in their closed positions, the tabs engage and overlie the integrated circuit device, serving to hold it snugly in place.

The carrier of this invention accepts formed lead integrated circuit devices right side up, as well as those integrated circuit devices having narrowly spaced leads. Also, due to the large center opening in the carrier, the circuit device may be marked on either its top or bottom.

Accordingly, it is an object of the invention to provide a carrier with opposed marginal tabs to hold an integrated circuit device.

Another object is to provide a novel single piece carrier which is for a flatpack integrated circuit device and which is of simple and reliable construction and operation.

Another object is to provide a carrier for an integrated circuit device which is easily adapted for automated loading and unloading.

Still another object is to provide a single piece carrier which is easily adapted to house several types of flatpack integrated circuit devices.

Other objects will become apparent upon a reading of the following description.

BRIEF DESCRIPTION OF THE DRAWINGS

FIG. 3 is a top plan view of the carrier of FIG. 1.

FIG. 4 is an end elevational view of the carrier of FIG. 1.

FIG. 5 is a bottom view of the carrier of FIG. 1.

DESCRIPTION OF THE PREFERRED EMBODIMENTS

Figure 1:
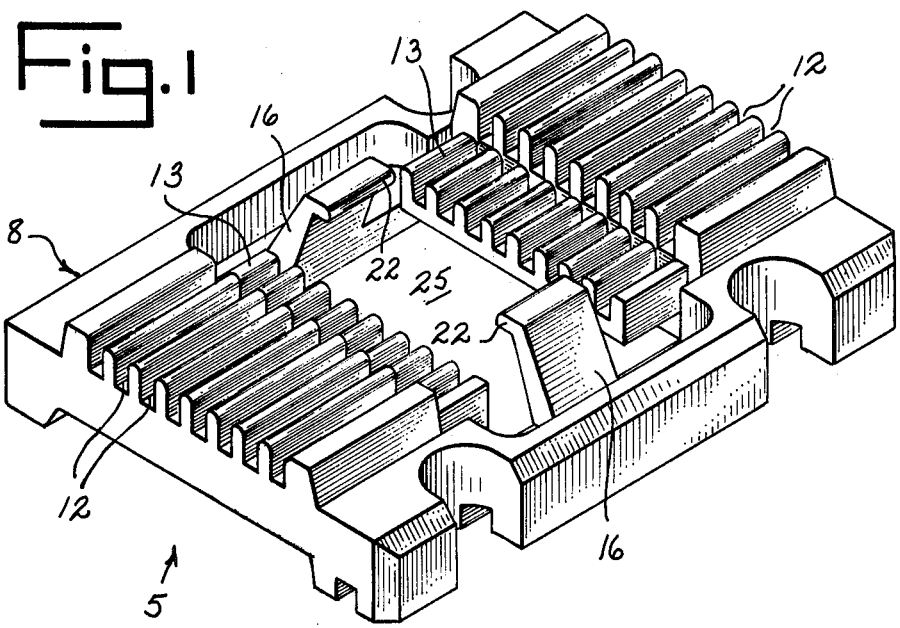
FIG. 1 is a perspective view of the one embodiment of the carrier.
Figure 2:
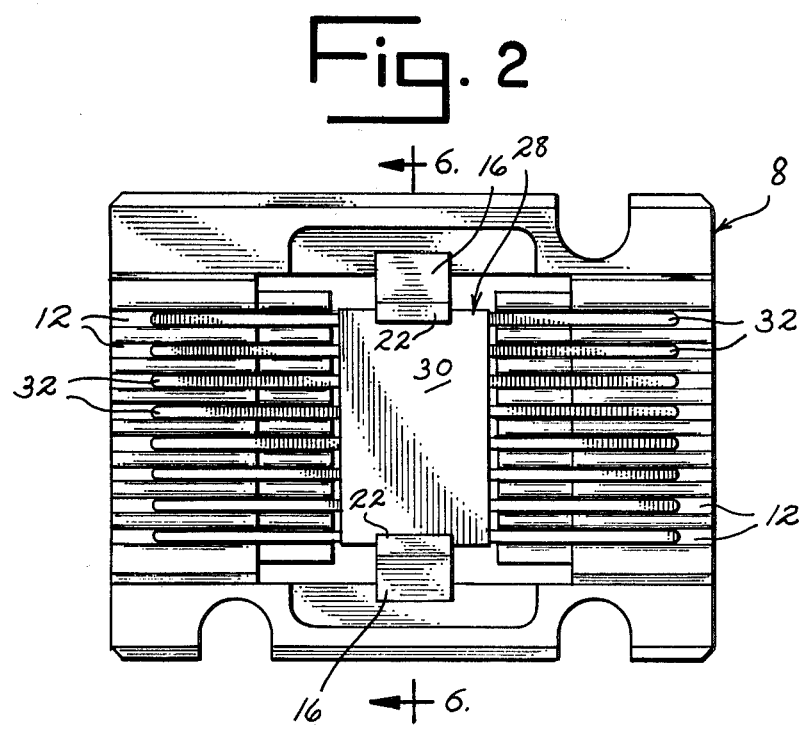
FIG. 2 is a top plan view of the carrier of FIG. 1 with an integrated circuit device secured therein.

The preferred embodiments illustrated are not intended to be exhaustive or to limit the invention to the precise forms disclosed. They are chosen and described in order to best explain the principles of the invention and its application and practical use to thereby enable others skilled in the art to best utilize the invention.

The carrier 5 shown in FIGS. 1-8 includes a frame 8 having an upper face 10 and a lower face 20. A center opening 25 is formed by frame 8 extending from upper face 10 to lower face 20. Opening 25 is defined by ends 24 and sides 26 and is sized to receive body 30 of an integrated circuit device 28. Spaced longitudinal grooves 12 are formed in frame face 10 and extend in opposite directions from sides 26 of opening 25 to accept extending leads 32 of integrated circuit device 28. An offset groove section 13 may be formed next to each side 26 to accommodate the leads of a formed lead device (not shown).

Figure 6:
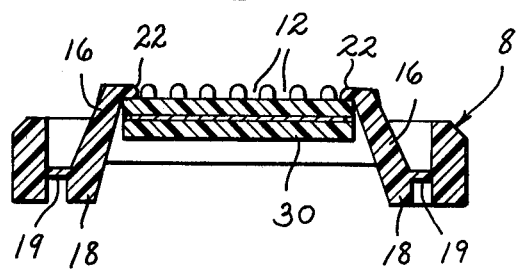
FIG. 6 is a sectional view taken along line 6—6 of FIG. 2.
Figure 7:
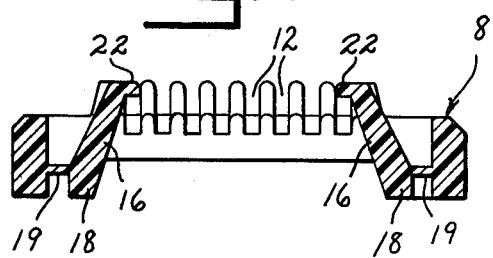
FIG. 7 is a sectional view taken along line 7—7 of FIG. 3.
Figure 8:
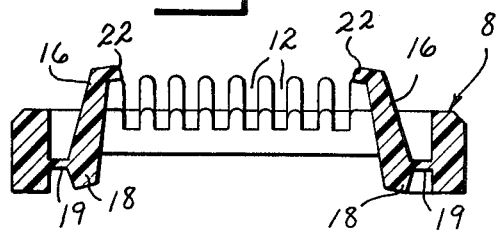
FIG. 8 is a sectional view like FIG. 7 but showing the tabs flexed into open positions.

A bar part 18 is located at each end 24 of opening 25 and extends between opening sides 26. An arm or tab 16 is connected at one end to each bar part 18 at its longitudinal center. Each tab 16 extends upwardly and generally inwardly, terminating in a lip 22. Each bar part 18 is rotatable about its longitudinal dimension in the manner of a torsion bar to accommodate movement of its connected tab 16 between a closed position, as seen in FIGS. 6 and 7, and an open outwardly flexed position, as shown in FIG. 8, to receive body 30 of device 28. A web 19 is shown extending between each bar part 18 and the frame to provide optional positioning support for the bar part.

Device 28 is secured within carrier frame 8 with the lips 22 engaging the body 30 of the device as the tabs 16 are returned to their closed positions from their flexed open positions due to the torsional biasing of bars part 18. The device may be released from carrier 5 by merely flexing the tabs 16 outwardly with the resulting rotation of bars part 18.

Figure 9:
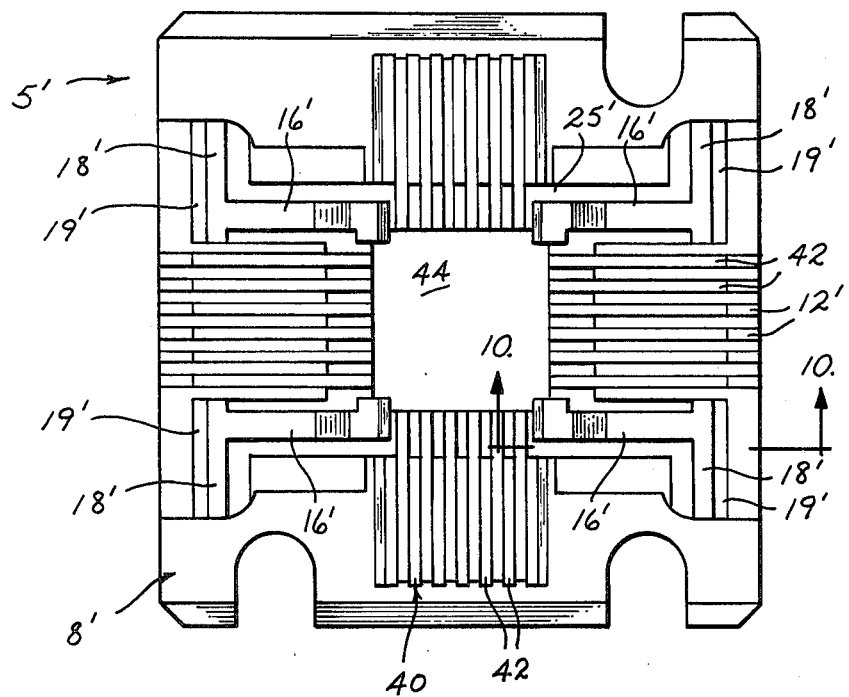
FIG. 9 is a top plan view of a second embodiment of the carrier.
Figure 10:
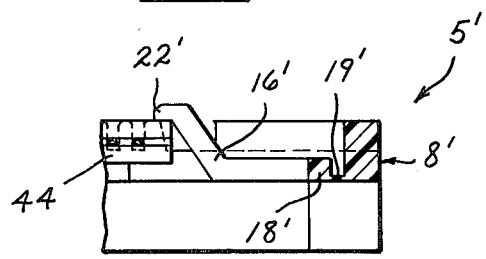
FIG. 10 is a fragmentary sectional view taken along line 10—10 of FIG. 9.

A second embodiment of the invention is illustrated in FIGS. 9 and 10, showing a carrier 5' accommodating a quadpack type of integrated circuit device 40. Tabs 16' are located at each corner of frame opening 25'. Grooves 12' accept leads 42 which extend from each side of body 44 of the integrated circuit device 40. Each tab 16' is connected at its one end to a torsional bar part 18' and has a lip 22' formed at its opposite end. A web 19' extends between each bar part 18' and carrier 8'. The manner of operation of tabs 16' and their supporting bar parts 18' is similar to the operation of tabs 16 and bar parts 18 shown in FIGS. 1-8.

It is to be understood the invention is not to be limited to the description above given but that it may be modified within the scope of the appended claims.

What I claim is:

1. A single piece carrier for an integrated circuit device having a body with leads extending therefrom, said carrier comprising a frame having upper and lower faces, said frame having a device-receiving opening extending from said upper face to said lower face, said upper face including spaced grooves, said frame opening for accommodating the body of said device and said frame grooves for receiving the leads of said device, at least two spaced apart arms projecing above said frame upper face, the lower end of each arm connected to a bar means extending between spaced sections of said frame adjacent the periphery of said frame opening, each bar means being rotatable about its longitudinal dimension for pivotally moving its connected arm between an open position wherein the leads of said device can be located within said frame grooves and a closed position wherein said device can be engaged by said connected arm to secure the device with its leads in said frame grooves to the carrier, each bar means being biased to urge its connected arm into its said closed position.

2. The carrier of claim 1 wherein said frame opening is defined by spaced sides and spaced ends, each bar means being located adjacently along a said frame end.

3. The carrier of claim 2 and a web extending between each bar means and said frame at its said adjacent frame end.

4. The carrier of claim 1 wherein said frame opening is defined by spaced sides and spaced ends joined at corners, each bar means being located adjacent a said corner.

5. The carrier of claim 4 and a web extending between each bar means and said frame at its said adjacent corner.

* * * * *